(12) United States Patent
Zanati et al.

(10) Patent No.: US 12,548,877 B2
(45) Date of Patent: Feb. 10, 2026

(54) PRINTED CIRCUIT BOARD (PCB) INCLUDING A VERTICAL LAUNCHER HAVING A SIGNAL VIA FOR RADIATING SIGNAL ENERGY THROUGH A PCB CHANNEL REGION

(71) Applicant: NXP B.V., Eindhoven (NL)

(72) Inventors: Abdellatif Zanati, Hamburg (DE); Adrianus Buijsman, Nijmegen (NL); Mark Steigemann, Ebstorf (DE)

(73) Assignee: NXP B.V., Eindhoven (NL)

( * ) Notice: Subject to any disclaimer, the term of this patent is extended or adjusted under 35 U.S.C. 154(b) by 592 days.

(21) Appl. No.: 17/938,066

(22) Filed: Oct. 5, 2022

(65) Prior Publication Data

US 2024/0121897 A1 Apr. 11, 2024

(51) Int. Cl.
| | |
|---|---|
| *H01P 5/103* | (2006.01) |
| *H01P 3/12* | (2006.01) |
| *H01Q 13/00* | (2006.01) |
| *H05K 1/11* | (2006.01) |
| *H05K 1/181* | (2026.01) |
| *H05K 3/00* | (2006.01) |
| *H01L 23/498* | (2006.01) |

(52) U.S. Cl.
CPC ............ *H01P 5/103* (2013.01); *H01P 3/121* (2013.01); *H01Q 13/00* (2013.01); *H05K 1/113* (2013.01); *H05K 1/119* (2013.01); *H05K 1/181* (2013.01); *H05K 3/0026* (2013.01); *H05K 3/0047* (2013.01); *H01L 23/49816* (2013.01); *H01L 2223/6622* (2013.01); *H05K 2201/09036* (2013.01); *H05K 2201/09072* (2013.01); *H05K 2201/09509* (2013.01); *H05K 2201/09518* (2013.01); *H05K 2201/096* (2013.01); *H05K 2201/09609* (2013.01); *H05K 2201/10734* (2013.01); *H05K 2203/107* (2013.01)

(58) Field of Classification Search
CPC ................................. H01P 5/103; H01P 3/121
USPC ............................................................ 333/26
See application file for complete search history.

(56) References Cited

U.S. PATENT DOCUMENTS 8,552,815 B2 * 10/2013 Fujii et al. ............. H01P 3/121
  333/248
10,594,041 B2 3/2020 Chayat et al.
(Continued)

OTHER PUBLICATIONS

Yong et al., "Research on Broadband RF Signal Transmission Structure Applied in 3D SIP", 2021 International Conference on Microwave and Millimeter Wave Technology (ICMMT), IEEE, May 23, 2021 (May 23, 2021), pp. 1-3.

*Primary Examiner* — Benny T Lee

(57) ABSTRACT

An apparatus includes a printed circuit board (PCB), a solder pad, a signal via, a plurality of metalized vias, and a waveguide. The PCB has a first surface opposite a second surface and includes a first metal layer, a second metal layer having a waveguide opening, and a PCB channel region from the waveguide opening in the second metal layer to the second surface. The solder pad is positioned on the first surface of the PCB over the channel region, and the signal via is coupled to the solder pad and a via pad in the second metal layer within the waveguide opening. The plurality of metalized vias extend from the first surface to the second surface of the PCB and form a boundary around the channel region. The waveguide is affixed to the waveguide opening in the second metal layer.

16 Claims, 13 Drawing Sheets

(56) References Cited

U.S. PATENT DOCUMENTS

| | | |
|---|---|---|
| 2009/0021329 A1* | 1/2009 | Huang et al. .......... H01L 23/66 |
| | | 333/24 R |
| 2011/0163919 A1 | 7/2011 | Suzuki |
| 2012/0032752 A1 | 2/2012 | Song et al. |
| 2017/0271761 A1 | 9/2017 | Purden et al. |
| 2018/0108968 A1 | 4/2018 | Purden et al. |
| 2018/0108971 A1* | 4/2018 | Connor et al. .......... H01P 5/103 |
| 2020/0287290 A1 | 9/2020 | Yao et al. |
| 2020/0294939 A1 | 9/2020 | Aleksov et al. |
| 2020/0381376 A1 | 12/2020 | Watanabe |
| 2021/0036393 A1 | 2/2021 | Mangaiahgari |
| 2021/0134612 A1 | 5/2021 | Van Gemert et al. |
| 2021/0210832 A1 | 7/2021 | Brandenburg et al. |

* cited by examiner

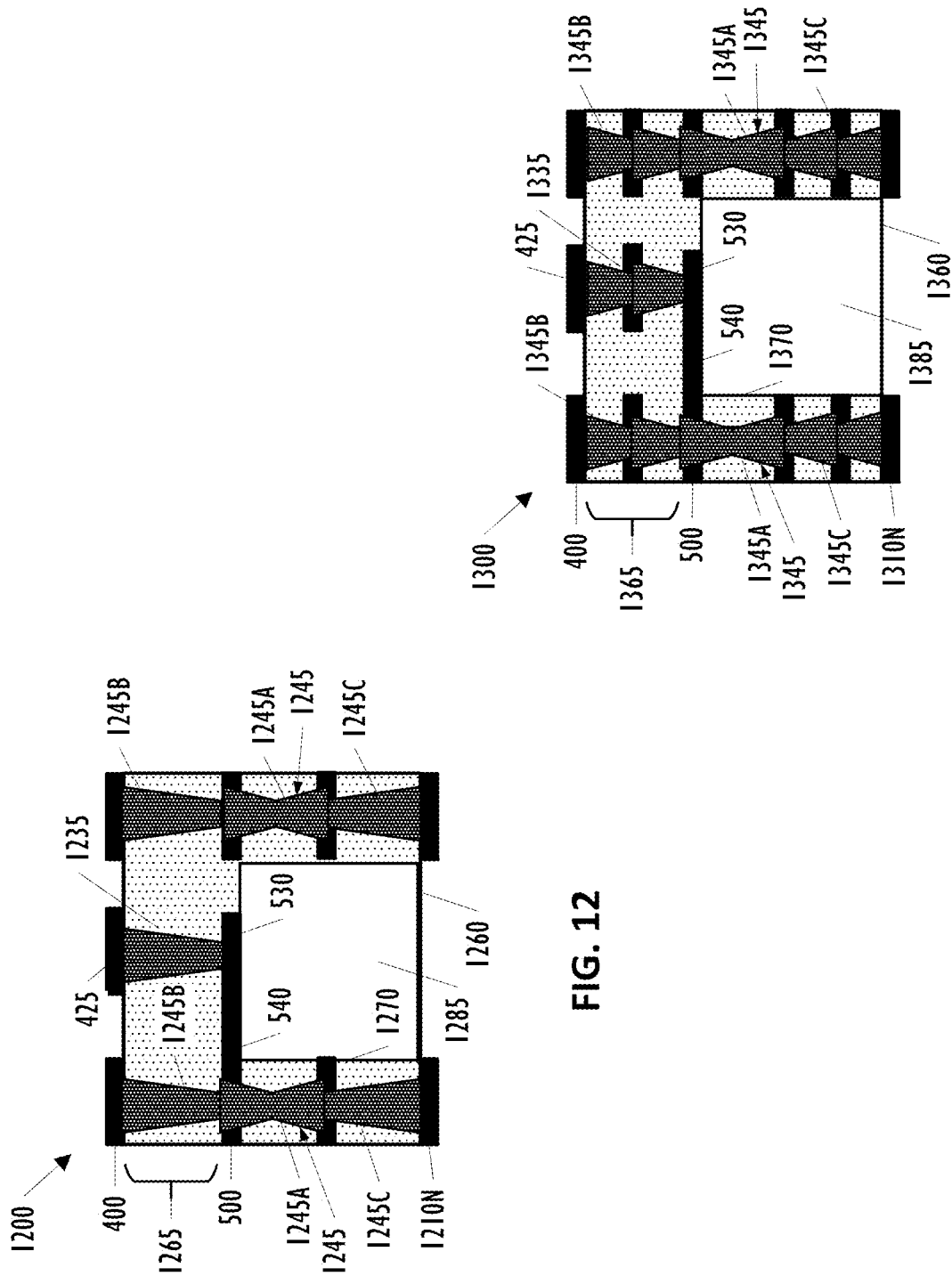

PRINTED CIRCUIT BOARD (PCB) INCLUDING A VERTICAL LAUNCHER HAVING A SIGNAL VIA FOR RADIATING SIGNAL ENERGY THROUGH A PCB CHANNEL REGION

BACKGROUND

Losses from signal transmission feedlines between antenna launchers within a transceiver circuit and external antenna arrays or waveguides have prompted the integration of antenna launchers into packaging and the development of three-dimensional (3D) waveguide antennas. However, integration of the antenna launcher increases the size of the package envelope and the corresponding manufacturing cost. In addition, the alignment of the antenna launchers with the 3D waveguide can increase the manufacturing complexity.

BRIEF DESCRIPTION OF THE DRAWINGS

The present invention may be better understood, and its numerous objects, features, and advantages made apparent to those skilled in the art by referencing the accompanying drawings.

FIG. 12 shows a cross section of an example PCB with an inductively coupled vertical signal launcher including a signal microvia and a plurality of grounded vias formed by laser drilling, in accordance with an embodiment of the present invention.

FIG. 13 shows a cross section of an example PCB with an inductively coupled vertical signal launcher including a stacked signal microvia and a plurality of grounded vias formed by laser drilling, in accordance with an embodiment of the present invention.

The use of the same reference symbols in the detailed description of the different drawings indicates identical items unless otherwise noted. The Figures are not necessarily drawn to scale.

DETAILED DESCRIPTION OF THE INVENTION

In conventional systems, the integration of the antenna launcher into the packaging increases the size of the package envelope, and alignment of the integrated antenna launchers with the 3D waveguide can increase the manufacturing complexity of the system as a whole. To address these challenges, embodiments of the disclosed invention combine the function of affixing a device package to a printed circuit board (PCB) with launching signals from the device package. In embodiments of the disclosed invention, signal solder balls help affix device packages to PCBs and carry signals between package-level signal interconnects and signals vias in the PCBs. Within the PCBs, signal vias radiate signals between the signal solder balls and waveguides and vice versa. The waveguides can be external 3D waveguides or substrate-integrated waveguides, and pluralities of grounded vias form borders around the signal vias.

Pluralities of grounded solder balls form borders around the signal solder balls and help affix the device packages to the PCBs more securely. The pluralities of grounded solder balls and grounded vias also help isolate the signal solder balls and signal vias, respectively, to reduce signal interference, channel cross-talk, and the like. The direct connection provided by the signal solder balls between package-level signal interconnects in the device packages and the signal vias in the PCBs simplify alignment between the device packages and the PCBs relative to conventional systems, such as the example of the conventional IC shown in FIG. 1.

Figure 1:
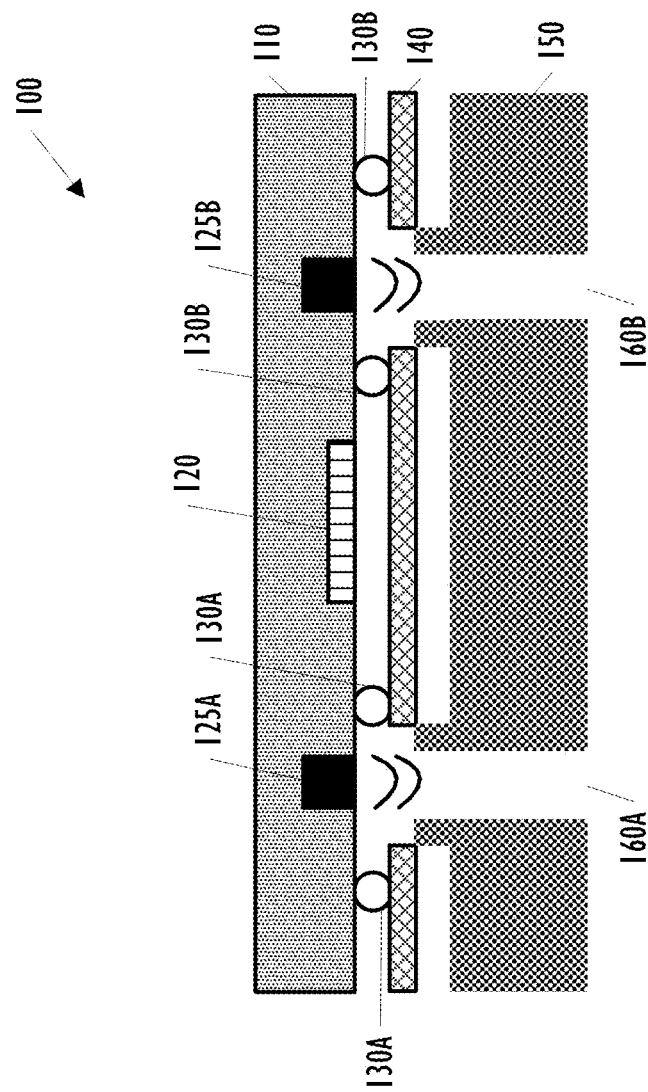
FIG. 1 shows a cross section of a conventional integrated circuit (IC) with antenna launchers on the underside of the device package affixed to a conventional waveguide and antenna array.

FIG. 1 shows a cross section 100 of an integrated circuit (IC) 120 with antenna launchers 125A-125B on the underside of a device package 110 affixed to a conventional PCB integrated waveguide 140 and an antenna array 150. The IC 120 can be a radar system, for example a millimeter (mm) wave radar system for automotive applications. The IC 120 is incorporated in the device package 110 with antenna launchers 125A-125B positioned at the underside of the package 110. The device package 110 is attached to the waveguide 140 by grounded solder balls 130A and 130B, and the waveguide 140 is affixed to the antenna array 150. The antenna launchers 125A-125B are aligned with the openings in the waveguide 140 and the antenna array 150 to form channels 160A-160B.

While the antenna launchers 125A-125B integrated in the underside of the device package 110 reduce the length of the feed lines to the antenna array 150, the antenna launchers 125A-125B increase the size and cost of the device package 110. In addition, the antenna launchers 125A-125B must be aligned with openings in the waveguide 140 and the antenna array 150, increasing the manufacturing complexity. Some radar systems require reflection of the radiated signal, which increases the substrate thickness of the IC 120 and further increases the size and cost of device package 110.

Figure 2:
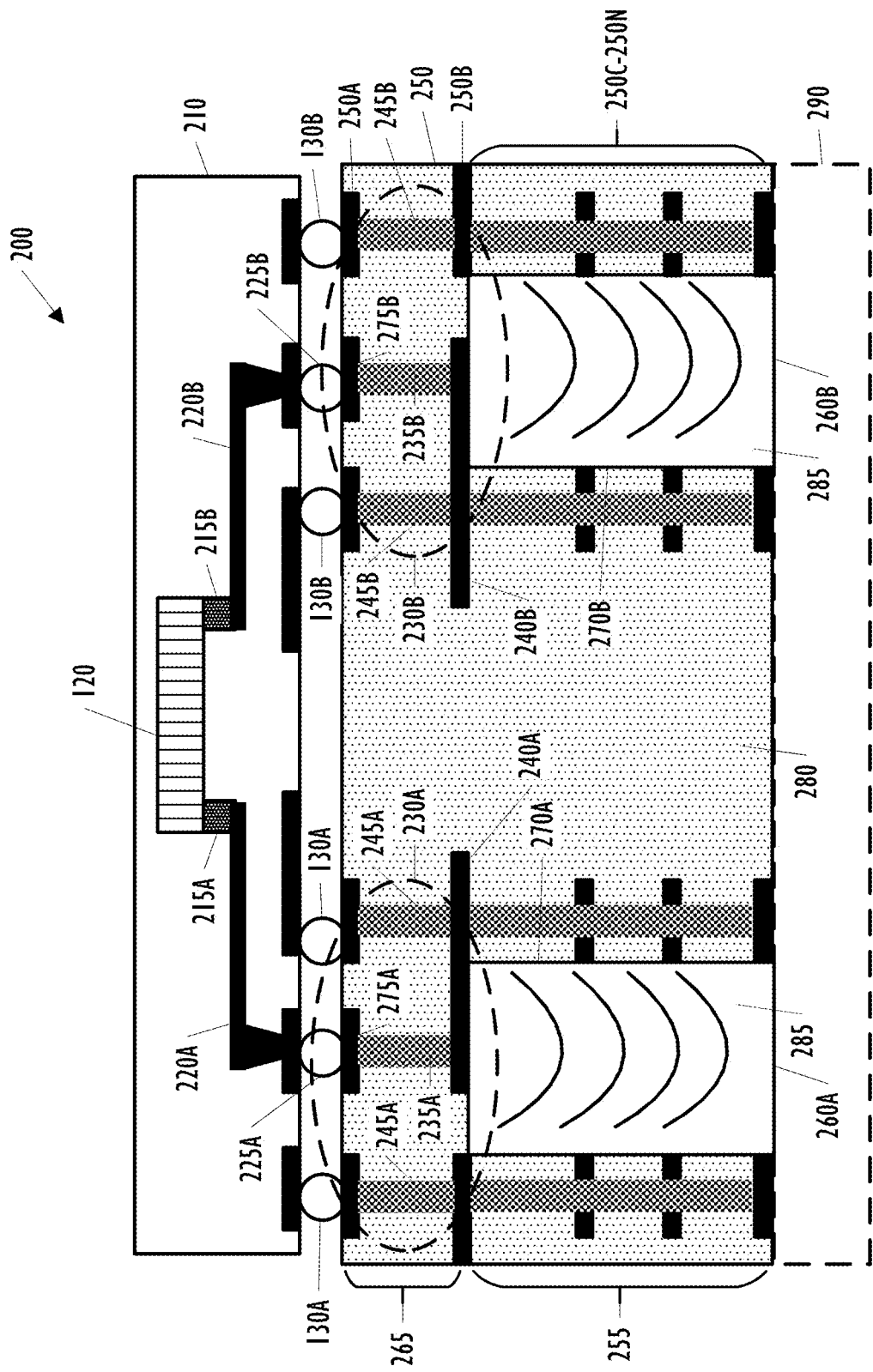
FIG. 2 shows a cross section of a system affixed to an example printed circuit board (PCB) with inductively coupled vertical signal launchers, in accordance with one embodiment of the present invention.

FIG. 2 shows a cross section of a system 200 affixed to an example printed circuit board (PCB) 250 with inductively coupled vertical signal launchers 230A-230B, in accordance with an embodiment of the invention. For ease of explanation, FIG. 2 is described herein with reference to the IC 120 and the grounded solder balls 130A-130B in FIG. 1. A package 210 includes the IC 120, semiconductor die-level signal interconnects 215A-215B, and package-level signal interconnects 220A-220B. The die-level signal interconnect 215A carries signals generated and received by the IC 120 between the IC 120 and the package-level signal interconnect 220A, and the die-level signal interconnect 215B carries signals generated and received by the IC 120 between the IC 120 and the package-level signal interconnect 220B. The package-level signal interconnects 220A-220B can be signal output pins for the package 210, in some implementations.

The package 210 is affixed to the PCB 250 by the grounded solder balls 130A and 130B. The PCB 250 has a number N of layers, including a first metal layer 250A, a second metal layer 250B, and third through the number N layers 250C-250N. The layers 250A-250N are substantially parallel to each other and substantially planar. Within the PCB 250, channel regions 270A and 270B are substantially perpendicular to the layers 250A-250N and extend from the second metal layer 250B to the Nth layer 250N. As used herein, "vertical" means substantially perpendicular to a planar surface, while "horizontal" means substantially parallel to a planar surface.

In some embodiments, the channel regions 270A-270B are filled with a different dielectric 285 than the dielectric 280 in the rest of the PCB 250. For example, the channel regions 270A-270B can be filled with the different dielectric 285 using a manufacturing process called "plugging" or can be left empty as air channels. In this example, the channel regions 270A-270B have a same dielectric 285, but in other implementations, the channel region 270A has a different dielectric than the channel region 270B. In some embodiments, the channel regions 270A-270B are vertical waveguides as shown in FIG. 2, but in other embodiments, the channel regions 270A-270B are horizontal waveguides, such as substrate-integrated waveguides.

In this example implementation, the PCB 250 has a same dielectric 280 throughout the layers 250A-250N, but in other implementations, as will be described further herein with respect to FIG. 3, the PCB can include a different dielectric between layers 250B and 250N than the dielectric between layers 250A and 250B. In addition to the grounded solder balls 130A-130B, signal solder balls 225A-225B also affix the package 210 to the PCB 250. The signal solder ball 225A couples the package-level interconnect 220A to a via pad 275A in the first metal layer 250A of the PCB 250, and the signal solder ball 225B couples the package-level interconnect 220B to a via pad 275B included in the first metal layer 250B of the PCB 250.

The vertical signal launchers 230A-230B include conductive signal vias 235A-235B, respectively, and pluralities of grounded vias 245A-245B, respectively. The signal via 235A couples the via pad 275A in the first metal layer 250A to a connector 240A in the second metal layer 250B, inductively coupling the signal solder ball 225A to a channel 260A. The signal via 235B couples the via pad 275B in the first metal layer 250B to the connector 240B in the second metal layer 250B, inductively coupling the signal solder ball 225B to a channel 260B. The connectors 240A-240B can be used to short the signal vias 235A-235B to ground, such that a broken signal ball 225 or other discontinuity of the signal path can be detected by injecting a dc current. In other implementations, the signal vias 235A-235B capacitively couple the signal solder balls 225A-225B to the channels 260A-260B, respectively, and are isolated within the vertical signal launchers 230A-230B, as described further herein with reference to FIG. 3. In this example, the second metal layer 250B is shown as the metal layer adjacent to the first metal layer 250A within the PCB 250, but in other implementations, one or more intervening layers, including intervening metal layers, can be present between the first metal layer 250A and the second metal layer 250B within the PCB 250.

The pluralities of grounded vias 245A-245B extend from the first layer 250A of the PCB 250 to the bottom, Nth layer 250N of the PCB 250 and have a height 265 between the first metal layer 250A and the second metal layer 250B plus a height 255 between the second metal layer 250B and the bottom, Nth layer 250N of the PCB 250. The plurality of grounded vias 245A form a boundary around the channel region 270A and signal via 235A and define the channel 260A. That is, the plurality of grounded vias 245A are arranged in a discontinuous ring bordering the channel region 270A and the signal via 235A, and form a cage to direct signal energy from the signal via 235A through the channel 260A. The plurality of grounded vias 245B form a boundary around the channel region 270B and the signal via 235B, and define the channel 260B. That is, the plurality of grounded vias 245B are arranged in a discontinuous ring bordering the channel region 270B and the signal via 235B, and form a cage to direct signal energy from the signal via 235B through the channel 260B. The pluralities of grounded vias 245A-245B may be metallized and form a shield structure around the channel regions 270A-270B and the signal vias 235A-235B, respectively. In addition, the pluralities of grounded vias 245A-245B form waveguides through the PCB 250 for signal energy radiated by the signal vias 235A-235B. That is, the signal vias 235A-235B and the connectors 240A-240B inductively couple the signal solder balls 225A-225B to the waveguides formed by the pluralities of grounded vias 245A-245B.

The package-level signal interconnect 220A is coupled to the signal via 235A in the PCB 250 by the signal solder ball 225A, and the package-level signal interconnect 220B is coupled to the signal via 235B in the PCB 250 by the signal solder ball 225B. Because the package-level signal interconnects 220A-220B are coupled to the signal vias 235A-235B by signal solder balls 225A-225B, alignment between the package 210 and the PCB 250 is simplified compared to the alignment between the antenna launchers 125A-125B in package 110 and the openings in waveguide 140 and the antenna array 150 shown in FIG. 1, reducing the manufacturing complexity of the system 200. For example, the package-level signal interconnects 220A-220B are directly coupled to the signal vias 235A-235B by the signal solder balls 225A-225B, respectively, such that the package 210 can be affixed to the PCB 250 using standard ball grid array techniques.

Although in this example the package-level signal interconnects 220A-220B bridge a vertical distance and a horizontal distance between the signal solder balls 225A-225B and the die-level signal interconnects 215A-215B, in other implementations the signal solder balls 225A-225B are not horizontally offset from the die-level signal transitions 215A-215B. That is, the signal solder balls 225A-225B are underneath the die-level signal transitions 215A-215B such that the package-level signal interconnects 220A-220B bridge only a vertical distance between the signal solder balls 225A-225B and the die-level signal interconnects 215A-215B, as illustrated in FIG. 3.

The plurality of grounded solder balls 130A-130B and the pluralities of grounded vias 245A-245B form vertically-continuous metalized structures to shield the signal paths through the signal solder balls 225A-225B, the signal vias 235A-235B, and the channels 260A-260B, respectively, reducing signal energy losses and cross talk between channels 260A and 260B. The pluralities of grounded vias 245A-245B form waveguides for channels 260A-260B, respectively, through the third layer 250C through Nth layer 250N of PCB 250. An external waveguide or antenna array 290 can be affixed to the opposite surface of the PCB 250 from the package 210. In some implementations, a substrate-integrated waveguide is incorporated in one or more layers of the third through Nth layers 250C-250N of the PCB 250.

The area of the PCB 250 occupied by the vertical signal launchers 230A-230B is determined based on the height 265 between the first metal layer 250A and the second metal layer 250B in the PCB 250 and the dielectric material 285 of the channel regions 270A-270B. For example, the length of the inductive path along the signal via 235A and the portion of connector 240A grounding the signal via 235A to the grounded vias 245A is equal to approximately one-fourth of the signal wavelength in the dielectric 285. For example, a system 200 has a dielectric-filled WR 12 waveguide, a height 265 equal to approximately 150 micrometers (μm), and accommodates a 77 gigahertz (GHz) signal. The length of the inductive path is approximately 150 μm plus 300 μm. The area of a surface of the PCB 250 occupied by a vertical signal launcher 230 is discussed further herein with respect to FIGS. 4-6.

Figure 3:
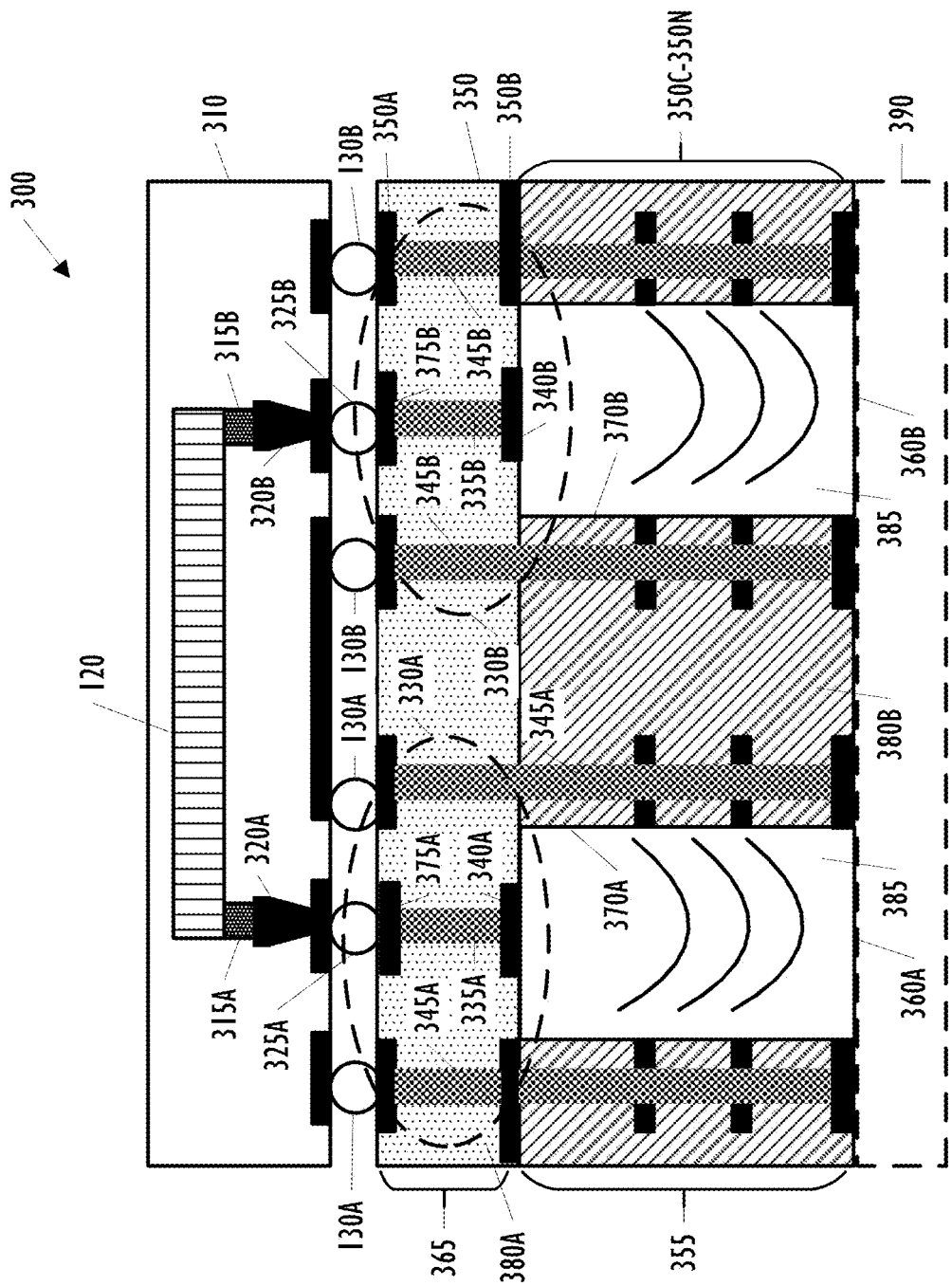
FIG. 3 shows a cross section of a system affixed to an example PCB with capacitively coupled vertical signal launchers, in accordance with an embodiment of the present invention.

FIG. 3 shows a cross section of a system 300 affixed to an example PCB 350 with capacitively coupled vertical signal launchers 330A-330B, in accordance with an embodiment of the invention. For ease of explanation, FIG. 3 is described herein with reference to the IC 120 and the grounded solder balls 130A-130B shown in FIG. 1 and the system 200 shown in FIG. 2. The system 300 is similar to the system 200 shown in FIG. 2, but includes capacitively coupled vertical signal launchers 330A-330B, rather than inductively coupled vertical signal launchers 230A-230B, as shown in FIG. 2.

A package 310 includes the IC 120, semiconductor die-level signal interconnects 315A-315B, and package-level signal interconnects 320A-320B. The die-level signal interconnect 315A carries signals generated and received by the IC 120 between the IC 120 and the package-level signal interconnect 320A, and the die-level signal interconnect 315B carries signals generated and received by the IC 120 between the IC 120 and the package-level signal interconnect 320B. The package 310 is affixed to a PCB 350 by the grounded solder balls 130A and 130B.

The PCB 350 has a number N of layers, including a first metal layer 350A, a second metal layer 350B, and third through the number N layers 350C-350N. The layers 350A-350N are substantially parallel to each other and substantially planar. Within the PCB 350, channel regions 370A and 370B are substantially perpendicular to the layers 350A-350N and extend from the second metal layer 350B to the Nth layer 350N. In some embodiments, the channel regions 370A-370B are filled with a different dielectric 385 than the dielectric 380 in the rest of the PCB 350. For example, the channel regions 370A-370B can be filled with the different dielectric 385 using a manufacturing process called "plugging" or can be left empty as air channels. In this example, the channel regions 370A-370B have a same dielectric 385, but in other implementations, the channel region 370A has a different dielectric than the channel region 370B. In some embodiments, the channel regions 370A-370B are vertical waveguides as shown in FIG. 3, but in other embodiments, the channel regions 370A-370B are horizontal waveguides, such as substrate-integrated waveguides.

In this example implementation, the PCB 350 has a first dielectric 380A between layers 350A and 350B and a second dielectric 380B between layers 350B and 350N. For example, the PCB 350 can be pressed and cured during the manufacturing process, resulting in a first dielectric 380A between layers 350A and 350B and a second dielectric 380B between layers 350B and 350N. In other implementations, the PCB 350 can include the same dielectric 380 throughout the layers 350A-350N, as described further herein with respect to FIG. 2.

In addition to the grounded solder balls 130A-130B, signal solder balls 325A-325B also affix the package 310 to the PCB 350. The signal solder ball 325A couples the package-level interconnect 320A to a via pad 375A in the first metal layer 350A of the PCB 350, and the signal solder ball 325B couples the package-level interconnect 320B to a via pad 375B in the first metal layer 350B of the PCB 350.

The vertical signal launchers 330A-330B include conductive signal vias 335A-335B, respectively, and pluralities of grounded vias 345A-345B, respectively. The signal via 335A couples the via pad 375A in the first metal layer 350A to a via pad 340A that is galvanically isolated within the channel region 370A from the second metal layer 350B and the plurality of grounded vias 345A, capacitively coupling the signal solder ball 325A to a channel 360A. The signal via 335B couples the via pad 375B in the first metal layer 350A to a via pad 340B that is galvanically isolated within the channel region 370B from the second metal layer 350B and the plurality of grounded vias 345B, capacitively coupling the signal solder ball 325B to a channel 360B. In this example, the second metal layer 350B is shown as the metal layer adjacent to the first metal layer 350A within the PCB 350, but in other implementations, one or more intervening layers, including intervening metal layers, can be present between the first metal layer 350A and the second metal layer 350B within the PCB 350.

The pluralities of grounded vias 345A-345B extend from the first layer 350A of the PCB 350 to the bottom, Nth layer 350N of the PCB 350 and have a height 365 between the first metal layer 350A and the second metal layer 350B plus a height 355 between the second metal layer 350B and the bottom, Nth layer 350N of the PCB 350. The plurality of grounded vias 345A form a boundary around the channel region 370A and the signal via 335A and define the channel 360A. That is, the plurality of grounded vias 345A are arranged in a discontinuous ring bordering the channel region 370A and the signal via 335A, and form a cage to direct signal energy from the signal via 335A through the channel 360A.

The plurality of grounded vias 345B form a boundary around the channel region 370B and the signal via 335B and define the channel 360B. That is, the plurality of grounded vias 345B are arranged in a discontinuous ring bordering the channel region 370B and the signal via 335B, and form a cage to direct signal energy from the signal via 335B through the channel 360B. The grounded vias 345A-345B may be metallized and form a shield structure around the signal vias 335A-335B. In addition, the pluralities of grounded vias 345A-345B form waveguides through the PCB 350 for signal energy radiated by the signal vias 335A-335B. That is, the signal vias 335A-335B capacitively couple the signal solder balls 325A-325B to the waveguides formed by the pluralities of grounded vias 345A-345B.

The package-level signal interconnect 320A is coupled to the signal via 335A in the PCB 350 by the signal solder ball 325A, and the package-level signal interconnect 320B is coupled to the signal via 335B in the PCB 350 by the signal solder ball 325B. Because the package-level signal interconnects 320A-320B are coupled to the signal vias 335A-335B by signal solder balls 325A-325B, alignment between the package 310 and the PCB 350 is simplified compared to the alignment between the antenna launchers 125A-125B in package 110 and the openings in waveguide 140 and the antenna array 150 shown in FIG. 1, reducing the manufacturing complexity of the system 300. For example, the package-level signal interconnects 320A-320B are directly coupled to the signal vias 335A-335B by the signal solder balls 325A-325B, respectively, such that the package 310 can be affixed to the PCB 350 using standard ball grid array techniques.

Although in this example the package-level signal interconnects 320A-320B bridge only a vertical distance between the signal solder balls 325A-325B and the die-level signal interconnects 315A-315B, in other implementations the signal solder balls 325A-325B are horizontally offset from the die-level signal interconnects 315A-315B. That is, the signal solder balls 325A-325B are not directly underneath the die-level signal interconnects 315A-315B such that the package-level signal interconnects 320A-320B bridge both a vertical distance and a horizontal distance between the signal solder balls 325A-325B and the die-level signal interconnects 315A-315B, as illustrated in FIG. 2. The package-level signal interconnects 320A-320B can be signal output pins for the package 310, in some implementations.

The plurality of grounded solder balls 130A-130B and the pluralities of grounded vias 345A-345B form vertically-continuous metalized structures to shield the signal paths through the signal solder balls 325A-325B, the signal vias 335A-335B, and the channels 360A-360B, respectively, reducing signal energy losses and cross talk between channels 360A and 360B. The pluralities of grounded vias 345A-345B form waveguides for channels 360A-360B, respectively, through the third layer 350C through Nth layer 350N of PCB 350. An external waveguide or antenna array 390 can be affixed to the opposite surface of the PCB 350 from the package 310. In some implementations, a substrate-integrated waveguide is incorporated in one or more layers of the third through Nth layers 350C-350N of the PCB 350.

The area of the PCB 350 occupied by the vertical signal launchers 330A-330B is determined based on the height 365 between the first metal layer 350A and the second metal layer 350B in the PCB 350 and the dielectric material 385 of the channel regions 370A-370B. For example, a standard PCB layer height 365 can be used, such as 127 µm. An external waveguide or antenna array 390 can be coupled to the opposite side of the PCB 350 from the package 310. In some implementations, a substrate-integrated waveguide is incorporated in one or more layers of the third through Nth layers 350C-350N of the PCB 350.

Figure 4:
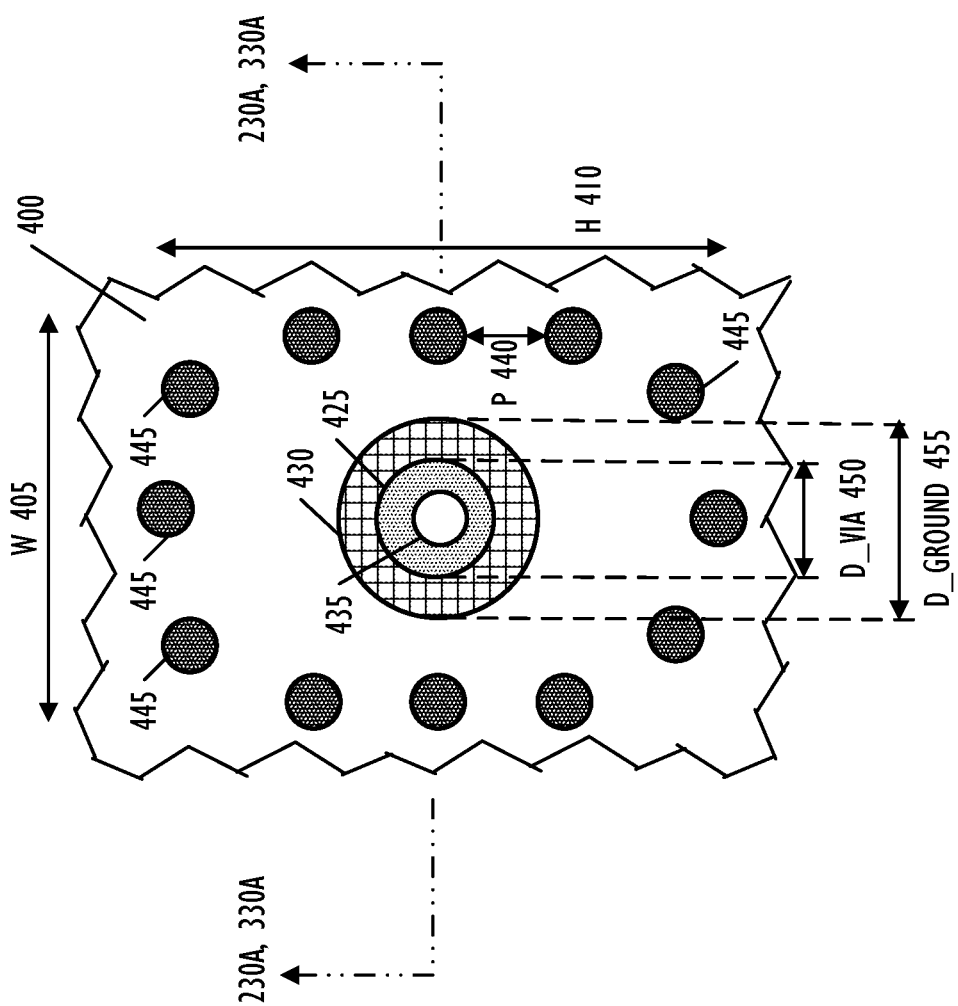
FIG. 4 shows an overhead view of a first metal layer of an example PCB vertical signal launcher, such as the inductively coupled vertical signal launchers shown in FIG. 2 and the capacitively coupled vertical signal launchers shown in FIG. 3, in accordance with an embodiment of the present invention.

FIG. 4 shows an overhead view of a first metal layer 400 of an example PCB vertical signal launcher, such as the inductively coupled vertical signal launchers 230A-230B shown in FIG. 2 and the capacitively coupled vertical signal launchers 330A-330B shown in FIG. 3, in accordance with an embodiment of the invention. That is, the overhead view of the first metal layer 400 shown in FIG. 4 corresponds to a portion of the first metal layer 250A shown in FIG. 2 that includes the vertical signal launcher 230A and to a portion of the first metal layer 350A shown in FIG. 3 that includes the vertical signal launcher 330A. The example PCB vertical signal launcher is rectangular in shape and has a width W 405 and a height H 410. In some implementations, the height H 410 is approximately twice the width W 405. Returning to the example implementation having a 77 GHz signal and a dielectric-filled WR 12 waveguide, the width W 405 is approximately 600 µm, and the height H 410 is approximately 1200 µm.

The first metal layer 400 includes portions of metallized, grounded vias 445 which form a boundary around the opening 430, which is an opening of a PCB channel region such as channel regions 270A-270B shown in FIG. 2 and channel regions 370A-370B shown in FIG. 3. That is, the plurality of grounded vias 445 are arranged in a discontinuous ring around the opening 430 of the channel region and form a cage to direct signal energy. A distance P 440 between the grounded vias 445 can be any appropriate distance such that the vias 445 direct signal energy through the PCB. For example, the distance P 440 can be a standard manufacturing distance such as 0.5 mm or 0.65 mm in some implementations.

Within the opening 430, a signal via 435 is coupled to a via pad 425 on which a signal solder ball is configured to be coupled. The term "via pad" and "solder pad" are used interchangeably herein. For example in the vertical signal launcher 230A shown in FIG. 2, the signal solder ball 225A is coupled to the via pad 275A as shown in FIG. 2, and in the vertical signal launcher 330A shown in FIG. 3, the signal solder ball 325A is coupled to the via pad 375A as shown in FIG. 3. The opening 430 in the metal layer 400 has a diameter D_ground 455, and the signal via 435 has a diameter D_via 450 within the opening 430. That is, the channel region corresponding to opening 430 has a diameter D_ground 455, and within the channel region corresponding to opening 430, the signal via 435 has a diameter D_via 450.

Figure 5:
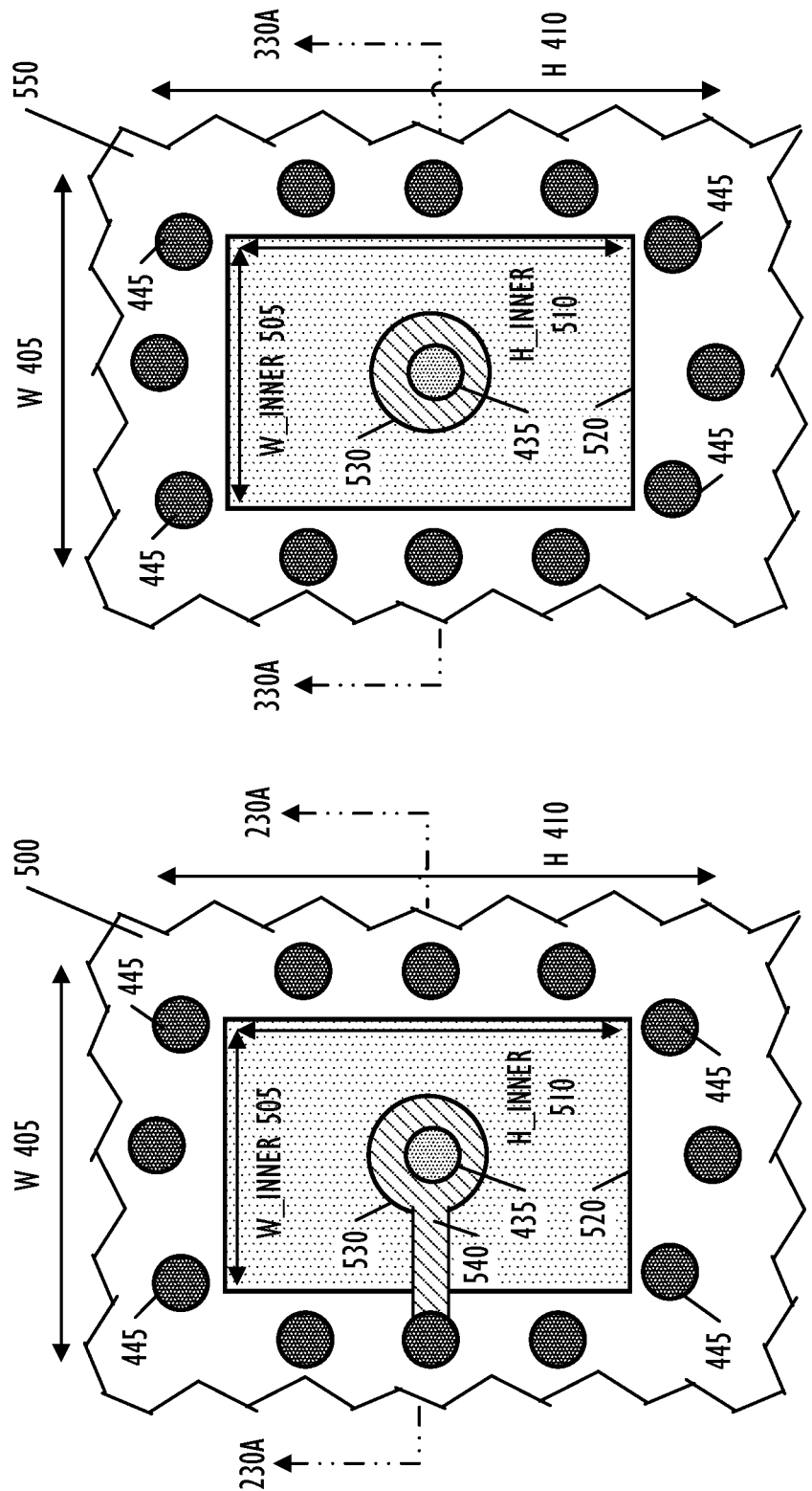
FIG. 5 shows overhead views of a second metal layer of an example inductively coupled PCB vertical signal launcher, such as the inductively coupled PCB vertical signal launcher shown in FIG. 2., and a second metal layer of an example capacitively coupled PCB vertical signal launcher, such as the capacitively coupled PCB vertical signal launcher shown in FIG. 3, in accordance with an embodiment of the present invention.

FIG. 5 shows overhead views of a second metal layer 500 of an example inductively coupled PCB vertical signal launcher, such as the inductively coupled PCB vertical signal launchers 230A-230B shown in FIG. 2, and a second metal layer 550 of an example capacitively coupled PCB vertical signal launcher, such as the capacitively coupled PCB vertical signal launchers 330A-330B shown in FIG. 3, in accordance with embodiments of the invention. That is, the overhead view of the second metal layer 500 shown in FIG. 5 corresponds to a portion of the second metal layer 250B shown in FIG. 2 that includes the vertical signal launcher 230A, and the overhead view of the second metal layer 550 shown in FIG. 5 corresponds to a portion of the second metal layer 350B shown in FIG. 3 that includes the vertical signal launcher 330A. For ease of explanation, the second metal layers 500 and 550 are described herein with reference to the first metal layer 400 shown in FIG. 4.

The second metal layers 500 and 550 include portions of the plurality of metallized, grounded vias 445 around a cross section 520 of the channel region, which includes a non-metalized dielectric PCB material such as dielectric 285 shown in FIG. 2 or dielectric 385 shown in FIG. 3. The cross section 520 is a waveguide opening within the second metal layers 500 and 550 and has a rectangular shape in this example, with a width W_inner 505 and a height H_inner 510. In some implementations, the height H_inner 510 is approximately twice the width W_inner 505.

Within the cross section 520 of the channel region, the signal via 435 is coupled to a via pad 530 in the second metal layers 500 and 550. In the second metal layer 500, the via pad 530 is inductively coupled to the surrounding metal by a connector 540. For example in vertical signal launcher 230A shown in FIG. 2, the signal via 235A is coupled to the surrounding metal layer 250B by the connector 240B. For vertical signal launchers including the second metal layer 500 and the inductively coupled signal via 435, a broken signal ball or other discontinuity of the signal path can be detected by injecting a dc current. In the second metal layer 550, the via pad 530 is galvanically isolated or floating within the cross section 520 of the channel region. For example in vertical signal launcher 330A shown in FIG. 3, the signal via 335A is coupled to the via pad 340A that is isolated within the channel region 370A of the second metal layer 350B.

Figure 6:
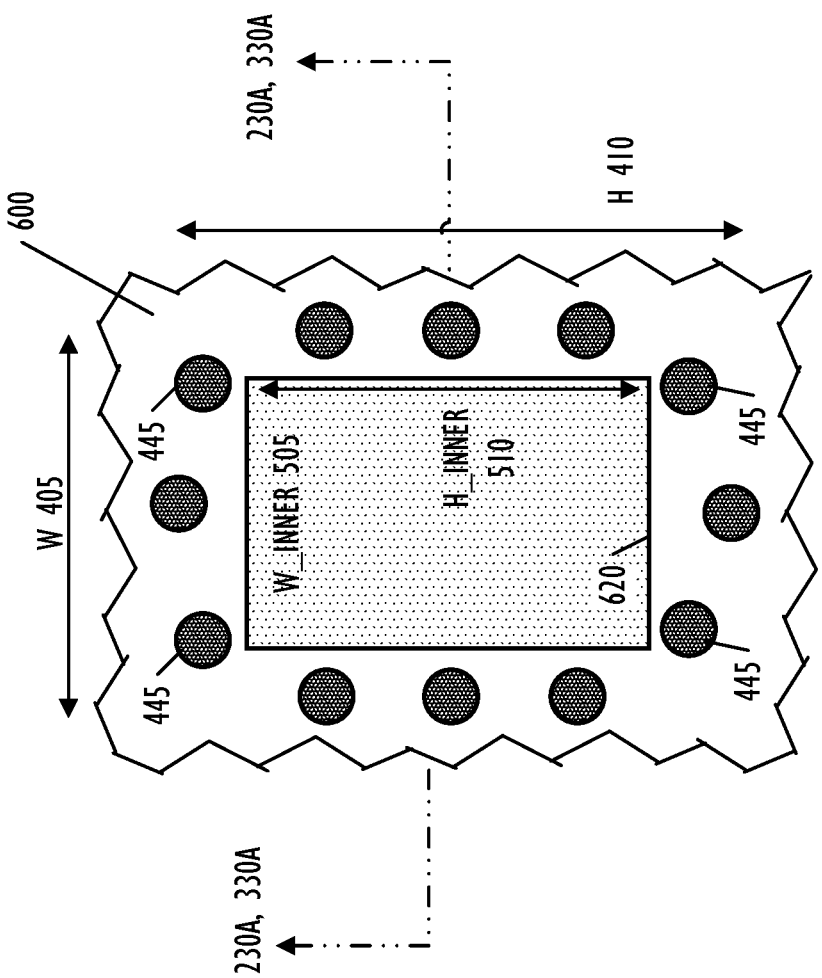
FIG. 6 shows an overhead view of an additional layer of the example PCB with vertical signal launchers, such as the inductively coupled vertical signal launchers shown in FIG. 2 and the capacitively coupled vertical signal launchers shown in FIG. 3, in accordance with an embodiment of the present invention.

FIG. 6 shows an overhead view of an additional layer 600 of the example PCB with vertical signal launchers, such as the inductively coupled vertical signal launchers 230A-230B shown in FIG. 2 and the capacitively coupled vertical signal launchers 330A-330B shown in FIG. 3, in accordance with an embodiment of the invention. For example, the PCB includes a number N of layers. The additional layer 600 illustrates the shape of the example vertical signal launcher in the third layer through the Nth layer of the PCB. That is, the overhead view of the additional layer 600 shown in FIG. 6 corresponds to a portion of a layer among the layers 250C-250N shown in FIG. 2 that includes the vertical signal launcher 230A and to a portion of a layer among the layers 350C-350N shown in FIG. 3 that includes the vertical signal launcher 330A.

For ease of explanation, the additional layer 600 is described herein with reference to the first metal layer 400 shown in FIG. 4 and the second metal layers 500 and 550 shown in FIG. 5. The additional layer 600 includes a portion of the plurality of metallized, grounded vias 445 around a cross section 620 of the channel region, which includes a non-metalized dielectric PCB material such as dielectric 285 shown in FIG. 2 or dielectric 385 shown in FIG. 3. In this implementation, the cross section 620 is the same rectangular shape as the cross section 520 in second metal layers 500 and 550 shown in FIG. 5, and has the width W_inner 505 and height H_inner 510. In other implementations, the cross section 620 can be a different shape than the cross section 520 in the second metal layers 500 and 550.

Figure 7:
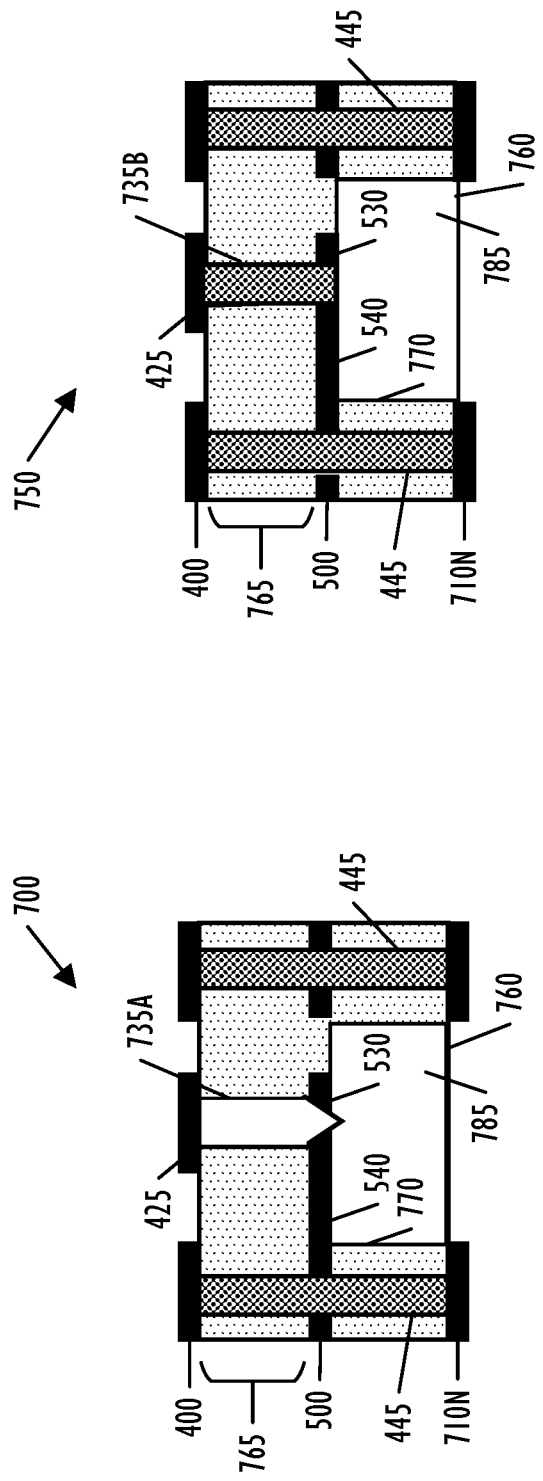
FIG. 7 shows cross sections of an example PCB with an inductively coupled vertical signal launcher being formed by mechanical drilling, in accordance with an embodiment of the present invention.

FIG. 7 shows cross sections 700 and 750 of an example PCB with an inductively coupled vertical signal launcher such as the vertical signal launcher 230A shown in FIG. 2 being formed by mechanical drilling, in accordance with an embodiment of the invention. For ease of explanation, cross sections 700 and 750 are described herein with reference to metal layers 400 and 500 shown in FIGS. 4 and 5, respectively. The cross section 700 shows the example PCB at a first stage of the manufacturing process, in which a mechanical drill is used to drill a first portion 735A of the signal via.

The mechanical drill can form a so-called "blind" via between the first via pad 425 in the first metal layer 400 and the second via pad 530 in the second metal layer 500 within a channel region 770. In some implementations, a dielectric thickness 765 between the first metal layer 400 and the second metal layer 500 is approximately 150 μm, and the first portion 735A of the signal via can be drilled in a single step. The channel region 770 can be filled with a dielectric 785 that is different from a dielectric in the rest of the PCB.

The example PCB also includes the plurality of grounded vias 445, which form a border around the signal via 735A. In this example, the signal via 735A is inductively coupled to the plurality of grounded vias 445 by the connector 540 in the second metal layer 500. The area of the PCB bordered by the grounded vias 445 and the channel region 770 in which the signal via 735B is drilled forms a channel 760. The plurality of grounded vias 445 can be formed by first mechanically drilling from the first metal layer 400 to the Nth layer 710N of the PCB, creating PCB through-holes. The PCB through-holes may then be metal plated to finish construction of the grounded vias 445.

Similarly, the first portion 735A of the signal via is metal plated in a second stage of the manufacturing process, as illustrated in cross section 750 of the example PCB. For example, the drilled portion 735A of the signal via can be metal plated and filled with copper to form the completed signal via 735B. In the cross section 750, construction of the metal plated signal via 735B is completed. In some implementations, the plating layer of the completed signal via 735B has a different coefficient of thermal expansion and material stiffness than the metal filling the plated portion of the signal via 735B.

The differences in thermal expansion and stiffness between the two materials can impact stress and strain inside the signal solder balls 225A-225B (FIG. 2) for inductively coupled vertical signal launchers or signal solder balls 325A-325B (FIG. 3) for capacitively coupled vertical signal launchers during temperature cycling of turn-on and turn-off of the signal generator and receiver in the IC 120 (FIG. 1). To reduce the impact of the differences in thermal expansion and stiffness between the metal plating and the inner material, underfill materials may be applied between the package 210 or 310 and the PCBs 250 or 350 as shown in FIGS. 2 and 3, respectively. Because the signal solder balls 225A-225B (FIG. 2) and 325A-325B (FIG. 3) are shielded by grounded solder balls 130A-130B (in FIG. 1), the underfill material has a reduced impact on transmission energy loss.

Figure 8:
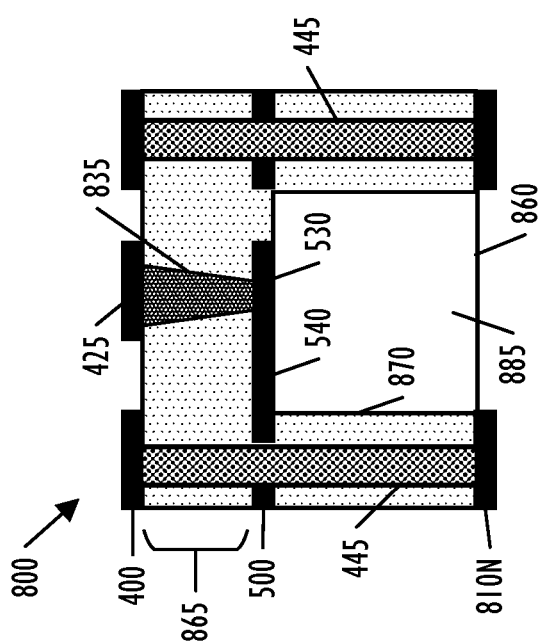
FIG. 8 shows a cross section of an example PCB with an inductively coupled vertical signal launcher formed by a combination of laser drilling and mechanical drilling, in accordance with an embodiment of the present invention.

FIG. 8 shows a cross section 800 of an example PCB with an inductively coupled vertical signal launcher such as the vertical signal launcher 230A shown in FIG. 2 formed by a combination of laser drilling and mechanical drilling, in accordance with an embodiment of the invention. For ease of explanation, cross section 800 is described herein with reference to metal layers 400 and 500 shown in FIGS. 4 and 5, respectively. The cross section 800 shows a signal via 835 formed by laser drilling. A laser-drilled via is also referred to herein as a "microvia". Laser drilling enables a smaller via diameter than mechanical drilling, and so vertical signal launchers including laser-drilled vias can be smaller than vertical signal launchers including mechanically-drilled vias.

In this example, the signal via 835 is formed by laser drilling, and the plurality of grounded vias 445 are formed by mechanical drilling. In other implementations, both the signal via 835 and the plurality of grounded vias 445 are formed by laser drilling. The microvia 835 extends a height 865 from the first via pad 425 in the first metal layer 400 to the second via pad 530 in the second metal layer 500 within a channel region 870. The channel region 870 can be filled with a dielectric 885 that is different from a dielectric in the rest of the PCB. The plurality of grounded vias 445 extend from the first metal layer 400 to the bottom, Nth layer 810N of the PCB. In this example, the signal via 835 is inductively coupled to the plurality of grounded vias 445 by the connector 540 in the second metal layer 500. The area of the PCB bordered by the grounded vias 445 and the channel region 870 in which the signal via 835 is drilled forms a channel 860.

Figure 9:
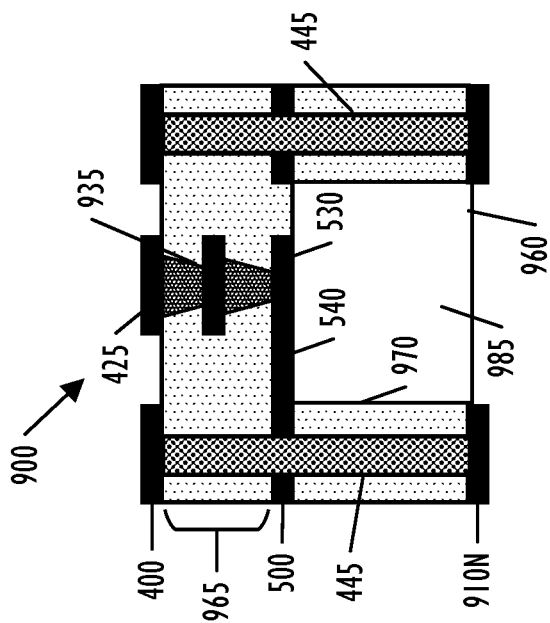
FIG. 9 shows a cross section of an example PCB with an inductively coupled vertical signal launcher formed by a combination of laser drilling and mechanical drilling, in accordance with an embodiment of the present invention.

FIG. 9 shows a cross section 900 of an example PCB with an inductively coupled vertical signal launcher such as the vertical signal launcher 230A shown in FIG. 2 formed by a combination of laser drilling and mechanical drilling, in accordance with an embodiment of the invention. For ease of explanation, cross section 900 is described herein with reference to metal layers 400 and 500 shown in FIGS. 4 and 5, respectively. The cross section 900 includes a signal via 935 that is formed by laser drilling, and the plurality of grounded vias 445 that are formed by mechanical drilling. In other implementations, both the signal via 935 and the plurality of grounded vias 445 are formed by laser drilling.

In cross section 900, the signal via 935 includes stacked microvias that extend a height 965 from the first via pad 425 in the first metal layer 400 to the second via pad 530 in the second metal layer 500 within a channel region 970. For example, the height 965 is 150 μm, and each microvia in the stack is approximately 75 μm. The channel region 970 can be filled with a dielectric 985 that is different from a dielectric in the rest of the PCB. The plurality of grounded vias 445 extend from the first metal layer 400 to the bottom, Nth layer 910N of the PCB. In this example, the signal via 935 is inductively coupled to the plurality of grounded vias 445 by the connector 540 in the second metal layer 500. The area of the PCB bordered by the plurality of grounded vias 445 and the channel region 970 in which the signal via 935 is drilled forms a channel 960.

Figure 10:
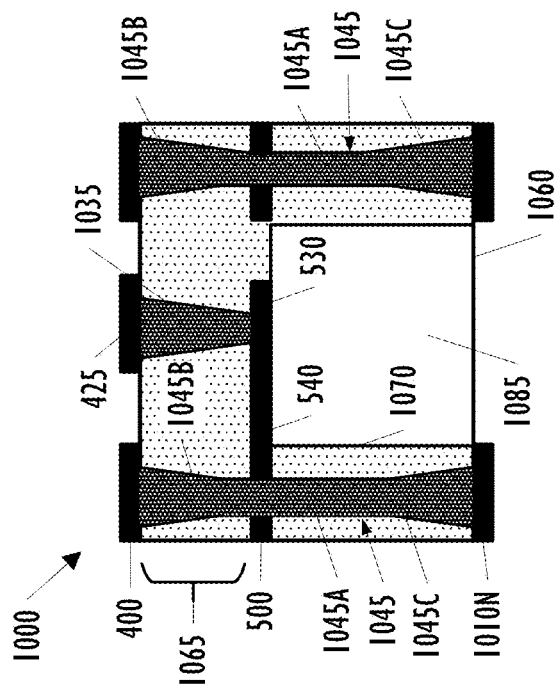
FIG. 10 shows a cross section of an example PCB with an inductively coupled vertical signal launcher including a signal microvia formed by laser drilling and a plurality of grounded vias formed by a combination of mechanical drilling and laser drilling, in accordance with an embodiment of the present invention.

FIG. 10 shows a cross section 1000 of an example PCB with an inductively coupled vertical signal launcher such as the vertical signal launcher 230A shown in FIG. 2, including a signal microvia 1035 formed by laser drilling and a plurality of grounded vias 1045 formed by a combination of mechanical drilling and laser drilling, in accordance with an embodiment of the invention. For ease of explanation, cross section 1000 is described herein with reference to metal layers 400 and 500 shown in FIGS. 4 and 5, respectively.

The cross section 1000 shows a signal via 1035 having a single microvia within a channel region 1070 and the plurality of grounded vias 1045 around the channel region 1070. The signal via 1035 extends a height 1065 from the first via pad 425 in the first metal layer 400 to the second via pad 530 in the second metal layer 500 within the channel region 1070. The channel region 1070 can be filled with a dielectric 1085 that is different from a dielectric in the rest of the PCB.

Each grounded via 1045 has a mechanically drilled portion 1045A and two laser-drilled portions 1045B-1045C. The first laser-drilled portion 1045B extends from the first metal layer 400 to the second metal layer 500 and has a height 1065. The second laser-drilled portion 1045C extends inward from the bottom Nth layer 1010N. The first and second laser-drilled portions 1045B-1045C are bridged by the mechanically drilled portion 1045A. The area of the PCB bordered by the grounded vias 1045 and the channel region 1070 in which the signal via 1035 is drilled forms a channel 1060.

Figure 11:
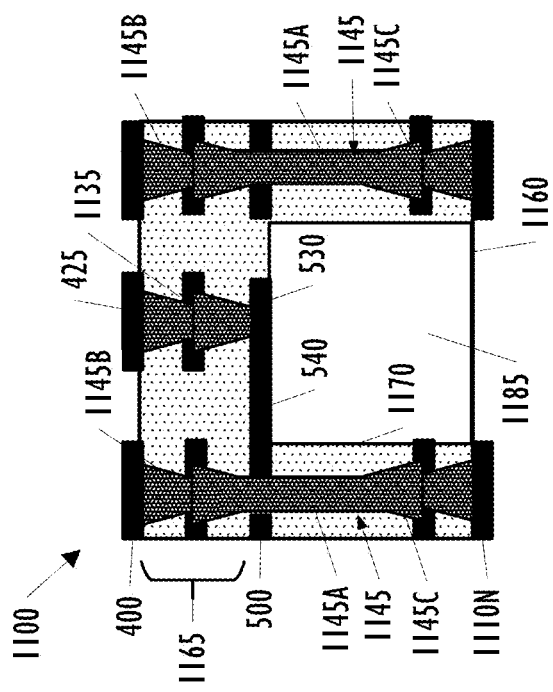
FIG. 11 shows a cross section of an example PCB with an inductively coupled vertical signal launcher including a signal microvia formed by laser drilling and a plurality of grounded vias formed by a combination of mechanical drilling and laser drilling, in accordance with an embodiment of the present invention.

FIG. 11 shows a cross section 1100 of an example PCB with an inductively coupled vertical signal launcher such as the vertical signal launcher 230A shown in FIG. 2, including a signal microvia 1135 formed by laser drilling and a plurality of grounded vias 1145 formed by a combination of mechanical drilling and laser drilling, in accordance with an embodiment of the invention. For ease of explanation, cross section 1100 is described herein with reference to metal layers 400 and 500 shown in FIGS. 4 and 5, respectively. In this example, the signal via 1135 includes stacked microvias within a channel region 1170, which can be filled with a dielectric 1185 that is different from a dielectric in the rest of the PCB.

Each grounded via 1145 includes a mechanically drilled portion 1145A and two laser-drilled, stacked microvia portions 1145B-1145C. The first stacked microvia portion 1145B extends from the first metal layer 400 to the second metal layer 500 and has a height 1165. The second stacked microvia portion 1145C extends inward from the bottom Nth layer 1110N. The first and second laser-drilled portions 1145B-1145C are bridged by the mechanically drilled portion 1145A. The area of the PCB bordered by the grounded vias 1145 and the channel region 1170 in which the signal via 1135 is drilled forms a channel 1160.

FIG. 12 shows a cross section 1200 of an example PCB with an inductively coupled vertical signal launcher such as the vertical signal launcher 230A shown in FIG. 2, including a signal microvia 1235 and a plurality of grounded vias 1245 formed by laser drilling, in accordance with an embodiment of the invention. For ease of explanation, cross section 1200 is described herein with reference to metal layers 400 and 500 shown in FIGS. 4 and 5, respectively.

In this example, the signal via 1235 includes a single microvia within a channel region 1270, which can be filled with a dielectric 1285 that is different from a dielectric in the rest of the PCB. Each grounded via 1245 includes an x-shaped via 1245A and microvia portions 1245B-1245C. The first microvia portion 1245B extends from the first metal layer 400 to the second metal layer 500 and has a height 1265. The second microvia portion 1245C extends inward from the bottom Nth layer 1210N. The first and second microvia portions 1245B-1245C are bridged by the x-shaped via portion 1245A, which is formed by sequential top and bottom side laser drilling. The area of the PCB bordered by the grounded vias 1245 and the channel region 1270 in which the signal via 1235 is drilled forms a channel 1260.

FIG. 13 shows a cross section 1300 of an example PCB with an inductively coupled vertical signal launcher such as the vertical signal launcher 230A shown in FIG. 2, including a stacked signal microvia 1335 and a plurality of grounded vias 1345 formed by laser drilling, in accordance with an embodiment of the invention. For ease of explanation, cross section 1300 is described herein with reference to metal layers 400 and 500 shown in FIGS. 4 and 5, respectively.

In this example, the signal via 1335 includes stacked microvias within a channel region 1370, which can be filled with a dielectric 1385 that is different from a dielectric in the rest of the PCB. Each grounded via 1345 includes an x-shaped via 1345A and stacked microvia portions 1345B-1345C. The first stacked microvia portion 1345B extends from the first metal layer 400 to the second metal layer 500 and has a height 1365. The second stacked microvia portion 1345C extends inward from the bottom Nth layer 1310N. The first and second stacked microvia portions 1345B-1345C are bridged by the x-shaped via portion 1345A. The area of the PCB bordered by the grounded vias 1345 and the channel region 1370 in which the signal via 1335 is drilled forms a channel 1360.

Figure 15:
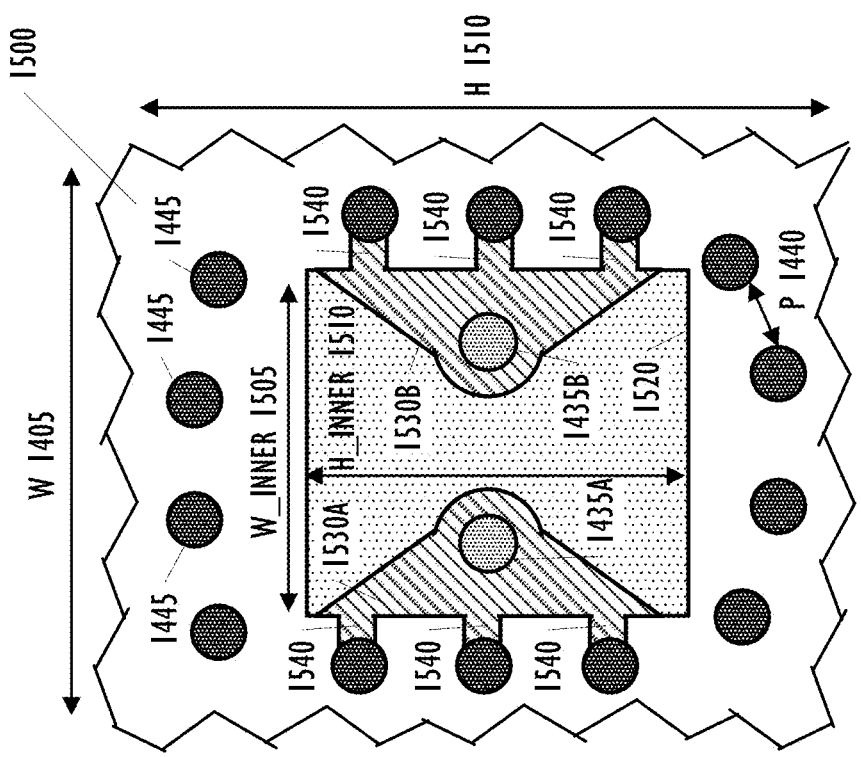
FIG. 15 shows overhead views of a second metal layer of an example inductively coupled, differential PCB vertical signal launcher, such as the inductively coupled PCB vertical signal launcher shown in FIG. 2, in accordance with an embodiment of the present invention.
Figure 16:
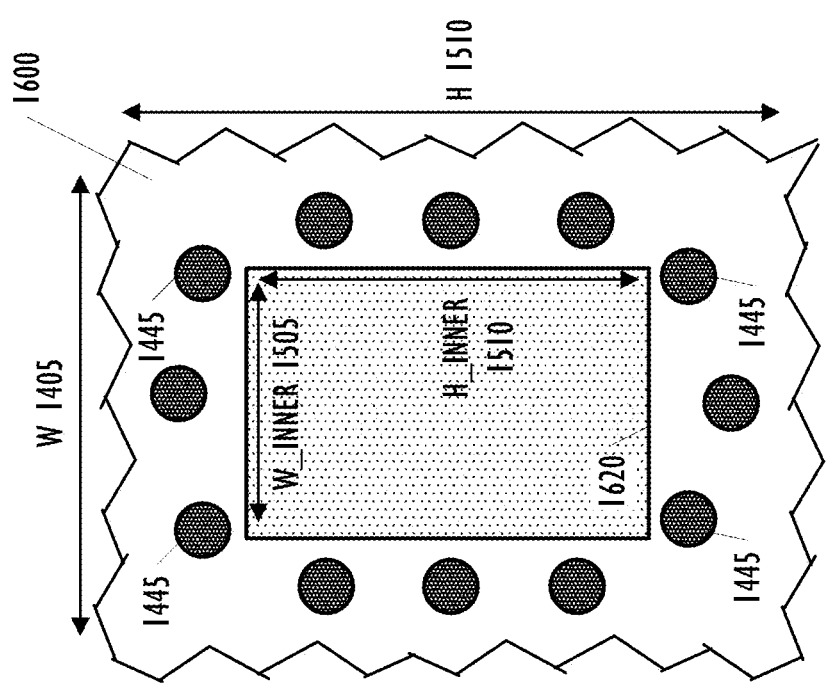
FIG. 16 shows an overhead view of an additional layer of the example PCB with differential vertical signal launchers, such as the inductively coupled vertical signal launchers shown in FIG. 2 and the capacitively coupled vertical signal launchers shown in FIG. 3, in accordance with an embodiment of the present invention.

The example PCBs shown in FIGS. 8-13 include inductively coupled vertical signal launchers such as the vertical signal launcher 230A shown in FIG. 2, but in other implementations the example PCBs include capacitively coupled vertical signal launchers such as the vertical signal launcher 330A shown in FIG. 3. Similarly, the combinations of single and stacked microvias formed by laser drilling and mechanically drilled vias shown in FIGS. 8-13 are for illustration only, and in other implementations, other combinations can be used. In addition, FIGS. 1-13 illustrate single ended vertical signal launchers, but in other implementations, the example PCB vertical signal launchers may be differential, as illustrated in FIGS. 14-16.

Figure 14:
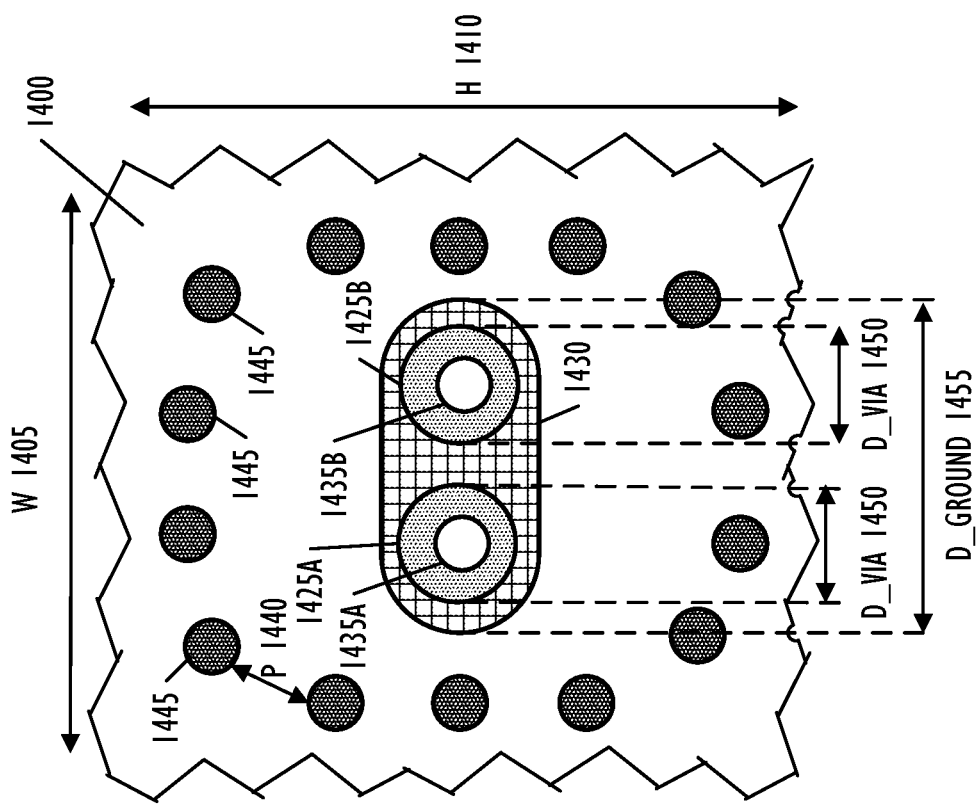
FIG. 14 shows an overhead view of a first metal layer of an example differential PCB vertical signal launcher, such as the inductively coupled vertical signal launchers shown in FIG. 2 and the capacitively coupled vertical signal launchers shown in FIG. 3, in accordance with an embodiment of the present invention.

FIG. 14 shows an overhead view of a first metal layer 1400 of an example PCB vertical differential signal launcher, similar to the inductively coupled vertical signal launchers 230A-230B shown in FIG. 2 and the capacitively coupled vertical signal launchers 330A-330B shown in FIG. 3, in accordance with an embodiment of the invention. The example PCB vertical signal launcher is rectangular in shape and has a width W 1405 and a height H 1410. In some implementations, the height H 1410 is approximately twice the width W 1405.

The first metal layer 1400 includes portions of metallized, grounded vias 1445 which form a boundary around an opening 1430, which is an opening of a PCB channel region in some embodiments from the top surface of the PCB to the bottom surface of the PCB. That is, the plurality of grounded vias 1445 are arranged in a discontinuous ring around the opening 1430 of the channel region and form a cage to direct signal energy. A distance P 1440 between the grounded vias 1445 can be any appropriate distance such that the vias 1445 direct the signal energy through the PCB. For example, the distance P 1440 can be a standard manufacturing distance such as 0.5 mm or 0.65 mm in some implementations.

Within the opening 1430, differential signal vias 1435A-1435B are coupled to solder pads 1425A-1425B, respectively, on which signal solder balls are configured to be coupled. For example in the vertical signal launcher 230A shown in FIG. 2, the signal solder ball 225A as shown in FIG. 2 can be coupled to the via pad 1425A or 1425B, and in the vertical signal launcher 330A shown in FIG. 3, the signal solder ball 325A as shown in FIG. 3 can be coupled to the via pad 1425A or 1425B. The opening 1430 in the grounded metal layer 1400 has a diameter D_ground 1455, and within the channel region corresponding to opening 1430, the signal vias 1435A and 1435B each have a diameter D_via 1450.

FIG. 15 shows an overhead view of a second metal layer 1500 of an example inductively coupled, differential PCB vertical signal launcher, such as the inductively coupled PCB vertical signal launchers 230A-230B shown in FIG. 2, in accordance with an embodiment of the invention. For ease of explanation, the second metal layer 1500 is described herein with reference to the first metal layer 1400 shown in FIG. 14. The second metal layer 1500 includes the plurality of metallized, grounded vias 1445 around a cross section 1520 of the channel region, which includes a non-metalized dielectric PCB material such as dielectric 285 shown in FIG. 2. The cross section 1520 can be a waveguide opening within the second metal layer 1500 and has a rectangular shape in this example, with a width W_inner 1505 and a height H_inner 1510. In some implementations, the height H_inner 1510 is approximately twice the width W_inner 1505.

The metal enclosing the cross section 1520 of the channel region can have a manufacturing width needed to enclose the plurality of grounded vias 1445 or can be part of a ground plane layer. Within the cross section 1520, the signal vias 1435A-1435B are coupled to via pads 1530A-1530B, respectively, in the second metal layer 1500. In the second metal layer 1500, the via pads 1530A-1530B are galvanically coupled to the surrounding metal by the connectors 1540. For vertical signal launchers including the second metal layer 1500 and the inductively coupled signal vias 1435A-1435B, a broken signal ball or other discontinuity of the signal path can be detected by injecting a dc current. A second metal layer 1500 for a capacitively coupled differential signal launcher omits the connecters 1540, and the via pads 1530A-1530B are galvanically isolated within the cross section 1520.

FIG. 16 shows an overhead view of an additional layer 1600 of the example PCB with differential vertical signal launchers, such as the inductively coupled vertical signal launchers 230A-230B shown in FIG. 2 and the capacitively coupled vertical signal launchers 330A-330B shown in FIG. 3, in accordance with an embodiment of the invention. For example, the PCB includes a number N layers. The additional layer 1600 illustrates the shape of the example vertical signal launcher in the third layer through the Nth layer of the PCB.

For ease of explanation, the additional layer 1600 is described herein with reference to the first metal layer 1400 shown in FIG. 14 and the second metal layer 1500 shown in FIG. 15. The additional layer 1600 includes a portion of the plurality of metallized, grounded vias 1445 around a cross section 1620 of the channel region, which includes a non-metalized dielectric PCB material such as dielectric 285 shown in FIG. 2 or the dielectric 385 shown in FIG. 3. In this implementation, the cross section 1620 is the same rectangular shape as the cross section 1520 in the second metal layer 1500 shown in FIG. 15, and has the width W_inner 1505 and height H_inner 1510. In other implementations, the cross section 1620 has a different shape than the cross section 1520 in the second metal layer 1500.

As can be seen, the disclosed vertical signal launchers simplify alignment of the device package and the PCB by directly coupling signal interconnects in the package to the signal vias in the PCB with signal solder balls. In addition, the direct connection reduces the number of signal transitions and the corresponding loss of signal strength. The plurality of grounded vias around a signal via and the plurality of grounded solder balls around a signal solder ball in one embodiment of the disclosed vertical signal launchers form a cage to direct signal energy through the PCB to a substrate-integrated or external waveguide or external antenna or the like, while reducing interference and crosstalk between adjacent channels. The disclosed vertical signal launchers can be manufactured using standard techniques and materials.

Features specifically shown or described with respect to one embodiment set forth herein may be implemented in other embodiments set forth herein.

In this description, the term "couple" may cover connections, communications, or signal paths that enable a functional relationship consistent with this description, including intermediate or intervening components that do not alter the functional relationship. A device that is "configured to" perform a task or function may be configured by programming or hardwiring, for example, at a time of manufacturing by a manufacturer and/or may be configurable or reconfigurable by a user after manufacturing. The configuring may be done through firmware and/or software, construction and/or layout of hardware components and connections, or any combination thereof. As used herein, "node", "pin", and "lead" are used interchangeably. A circuit or device described herein as including certain components may be adapted to be coupled to those components instead, to form the described circuitry or device.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

An apparatus includes a PCB, a solder pad, a signal via, a plurality of metalized vias, and a waveguide. The PCB has a first surface opposite a second surface and includes a first metal layer, a second metal layer having a waveguide opening, and a PCB channel region from the waveguide opening in the second metal layer to the second surface of the PCB. The solder pad is positioned on the first surface of the PCB over the PCB channel region, and the signal via is coupled to the solder pad and to a via pad in the second metal layer within the waveguide opening. The plurality of metalized vias extend from the first surface to the second surface of the PCB and form a boundary around the PCB channel region. The waveguide is affixed to the waveguide opening in the second metal layer.

In some implementations, the waveguide is a substrate-integrated waveguide incorporated in the PCB. The waveguide can include the plurality of metalized vias from the second metal layer to the second surface of the PCB. In some implementations, the apparatus further includes a device affixed to the first surface of the PCB. The device includes an integrated circuit and a signal output pin coupled to the integrated circuit. A signal solder ball couples the signal output pin to the solder pad on the first surface of the PCB. In some implementations, a plurality of grounded solder balls affix the device to the plurality of metalized vias. In some implementations, the signal via inductively couples the signal solder ball to the waveguide.

A PCB having a first surface opposite a second surface includes a vertical signal launcher. The vertical signal launcher includes a PCB channel region, a signal via, and a plurality of metalized vias. The signal via is coupled to a first via pad in a first metal layer of the PCB and to a second via pad in a second metal layer of the PCB. The PCB channel region extends from the second metal layer of the PCB to the second surface of the PCB. The plurality of metalized vias extend from the first surface of the PCB to the second surface of the PCB and form a boundary around the PCB channel region.

In some implementations, a device package is affixed to the first surface of the PCB, and the device package includes an integrated circuit and a signal output pin coupled to the integrated circuit. A signal solder ball couples the signal output pin to the first via pad in the vertical signal launcher of the PCB. In some implementations, a plurality of grounded solder balls affix the device package to the plurality of metalized vias. In some implementations, the signal via capacitively couples the signal solder ball to a waveguide in the vertical signal launcher, and the waveguide includes the plurality of metalized vias from the second metal layer to the second surface of the PCB. The signal via is substantially isolated within the plurality of metalized vias. In other implementations, the signal via inductively couples the signal solder ball to a waveguide in the vertical signal launcher, and the waveguide includes the plurality of metalized vias from the second metal layer to the second surface of the PCB. The signal via is galvanically coupled to the second metal layer. In some implementations, an external waveguide is affixed to the second surface of the PCB. The PCB may further include a substrate-integrated waveguide adjacent to the second metal layer of the PCB.

A method includes forming a signal via and a solder pad in a PCB. The signal via extends from a first metal layer of the PCB to a second metal layer of the PCB, and the solder pad is positioned on a first surface of the PCB and coupled to the signal via. A channel region is formed from the second metal layer of the PCB to a second surface of the PCB opposite the first surface of the PCB. A plurality of grounded vias are formed from the first metal layer to the second surface of the PCB, such that the plurality of grounded vias border the channel region. In some implementations, the signal via and/or the plurality of grounded vias are mechanically drilled through the PCB. In other implementations, the signal via and/or the plurality of grounded vias are laser drilled through the PCB. In some implementations, each grounded via in the plurality of grounded vias are formed by laser drilling a first microvia from the first surface of the PCB, laser drilling a second microvia from the second surface of the PCB, and mechanically drilling between the first microvia and the second microvia.

What is claimed is:

1. A printed circuit board (PCB) having a first surface and a second surface opposite the first surface, the PCB comprising:
   a vertical signal launcher comprising:
      a PCB channel region from a second metal layer of the PCB to the second surface of the PCB;
      a signal via coupled to a first via pad in a first metal layer, the first via pad being an exposed portion of the first metal layer at the first surface of the PCB and to a second via pad in the second metal layer of the PCB, the second metal layer within the PCB between the first surface and the second surface, wherein the second via pad is formed from and electrically isolated from the second metal layer and positioned within the PCB channel region; and
      a plurality of metalized vias from the first surface of the PCB to the second surface of the PCB and forming a boundary around the PCB channel region; and wherein the vertical signal launcher is configured to radiate signal energy from the second via pad through the PCB channel region toward the second surface; and wherein an external waveguide is affixed to the second surface of the PCB.

2. The PCB of claim 1, wherein a device package is affixed to the first surface of the PCB, the device package comprising:
   an integrated circuit (IC); and
   a signal output pin coupled to the IC, wherein a signal solder ball couples the signal output pin to the first via pad in the vertical signal launcher of the PCB.

3. The PCB of claim 2, wherein a plurality of grounded solder balls affix the device package to the plurality of metalized vias.

4. The PCB of claim 2, wherein:
   the vertical signal launcher comprises a waveguide formed by a portion of each of the plurality of metalized vias that extends from the second metal layer to the second surface of the PCB; and
   the signal via capacitively couples the signal solder ball to the waveguide in the vertical signal launcher.

5. The PCB of claim 4, wherein the signal via is substantially isolated within the PCB channel region.

6. The PCB of claim 2, wherein:
   the vertical signal launcher comprises a waveguide formed by a portion of each of the plurality of metalized vias that extends from the second metal layer to the second surface of the PCB; and
   the signal via inductively couples the signal solder ball to the waveguide in the vertical signal launcher.

7. The PCB of claim 6, wherein the signal via is galvanically coupled to the second metal layer.

8. The PCB of claim 1, further comprising a substrate-integrated waveguide adjacent to the second metal layer of the PCB, wherein the substrate-integrated waveguide comprises the plurality of metalized vias from the second metal layer to the second surface of the PCB.

9. A method comprising:
   forming a signal via and a solder pad, wherein the signal via extends from a first metal layer at or proximate to a first surface of a printed circuit board (PCB) to a via pad of a second metal layer within the PCB between the first surface and a second surface of the PCB that is opposite to the first surface, wherein the second metal layer is patterned to form a waveguide opening including the via pad, and wherein the solder pad is positioned on the first surface of the PCB and coupled to the signal via;
   forming a channel region extending from the second metal layer of a printed circuit board (PCB) to the second surface of the PCB, wherein a portion of the signal via in the second metal layer is included in the channel region and configured to radiate signal energy toward the second surface; and
   forming a plurality of grounded vias from the first metal layer to the second surface of the PCB, such that the plurality of grounded vias border the channel region; and wherein forming the signal via comprises laser drilling the signal via.

10. The method of claim 9, wherein forming the plurality of grounded vias comprises laser drilling the plurality of grounded vias.

11. The method of claim 9, wherein forming each grounded via in the plurality of grounded vias comprises:
   laser drilling a first microvia from the first surface of the PCB;
   laser drilling a second microvia from the second surface of the PCB; and
   mechanically drilling between the first microvia and the second microvia.

12. The method of claim 9, wherein forming the plurality of grounded vias comprises mechanically drilling the plurality of grounded vias.

13. An apparatus comprising:
   a printed circuit board (PCB) having a first surface and a second surface opposite the first surface, the PCB comprising:
      a first metal layer on or proximate to the first surface and patterned to form a first solder pad and a plurality of second solder pads,
      a second metal layer within the PCB between the first surface and the second surface, the second metal layer patterned to form a waveguide opening including a via pad, and
      a PCB channel region from the waveguide opening in the second metal layer to the second surface of the PCB;
   a signal via coupled to the first solder pad and to the via pad in the second metal layer;
   a plurality of metalized vias from the plurality of second solder pads at the first surface to the second surface of the PCB and forming a boundary around the PCB channel region; and
   a waveguide affixed to the waveguide opening in the second metal layer; and
   wherein the via pad is configured to radiate signal energy toward the second surface of the PCB through the PCB channel region;
   wherein the signal via inductively couples a signal solder ball to the waveguide.

14. The apparatus of claim 13, wherein the waveguide is a substrate-integrated waveguide comprised in the PCB, and wherein the waveguide comprises the plurality of metalized vias from the second metal layer to the second surface of the PCB.

15. The apparatus of claim 13, further comprising a device affixed to the first surface of the PCB, the device comprising:
   an integrated circuit (IC); and
   a signal output pin coupled to the IC, wherein the signal solder ball couples the signal output pin to the first solder pad on the first surface of the PCB.

16. The apparatus of claim 15, wherein a plurality of grounded solder balls affix the device to the plurality of second solder pads and to the plurality of metalized vias.

* * * * *